(12) United States Patent
Hwang

(10) Patent No.: US 12,230,822 B2
(45) Date of Patent: Feb. 18, 2025

(54) ELECTRIC COMPONENT HOUSING OF BATTERY MODULE

(71) Applicant: LG Energy Solution, Ltd., Seoul (KR)

(72) Inventor: Sung-Tack Hwang, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 696 days.

(21) Appl. No.: 17/439,073

(22) PCT Filed: Jul. 27, 2020

(86) PCT No.: PCT/KR2020/009888
§ 371 (c)(1),
(2) Date: Sep. 14, 2021

(87) PCT Pub. No.: WO2021/029570
PCT Pub. Date: Feb. 18, 2021

(65) Prior Publication Data
US 2022/0158287 A1 May 19, 2022

(30) Foreign Application Priority Data
Aug. 13, 2019 (KR) .................. 10-2019-0098993

(51) Int. Cl.
| | |
|---|---|
| *H01M 50/224* | (2021.01) |
| *H01M 10/6551* | (2014.01) |
| *H01M 50/244* | (2021.01) |
| *H01M 50/502* | (2021.01) |
| *B29C 45/14* | (2006.01) |
| *B29K 705/00* | (2006.01) |
| *B29L 31/34* | (2006.01) |

(52) U.S. Cl.
CPC ..... *H01M 50/224* (2021.01); *H01M 10/6551* (2015.04); *H01M 50/244* (2021.01); *H01M 50/502* (2021.01); *B29C 45/14336* (2013.01); *B29K 2705/00* (2013.01); *B29L 2031/3468* (2013.01)

(58) Field of Classification Search
CPC ................................................. H01M 10/6551
See application file for complete search history.

(56) References Cited

U.S. PATENT DOCUMENTS

| 7,951,478 B2 * | 5/2011 | Takamatsu .......... H01M 10/647 429/153 |
|---|---|---|
| 2007/0238016 A1 | 10/2007 | Takamatsu |
| 2009/0145676 A1 | 6/2009 | Takasaki et al. |

(Continued)

FOREIGN PATENT DOCUMENTS

| CN | 110073461 A | 7/2019 |
|---|---|---|
| EP | 3045288 A1 | 7/2016 |

(Continued)

OTHER PUBLICATIONS

International Search Report for PCT/KR2020/009888 mailed Oct. 28, 2020. 2 pgs.

(Continued)

*Primary Examiner* — Karie O'Neill Apicella
(74) *Attorney, Agent, or Firm* — Lerner David LLP

(57) ABSTRACT

An electric component housing for accommodating electric components including a housing body forming an appearance of the electric component housing, and a metal support structure embedded inside the housing body.

9 Claims, 5 Drawing Sheets

(56) References Cited

U.S. PATENT DOCUMENTS

| | | |
|---|---|---|
| 2010/0188834 A1 | 7/2010 | Snider et al. |
| 2013/0059187 A1 | 3/2013 | Kang et al. |
| 2013/0149583 A1 | 6/2013 | Kurita |
| 2014/0178716 A1 | 6/2014 | Wang |
| 2014/0239904 A1 | 8/2014 | Tanaka et al. |
| 2018/0102573 A1 | 4/2018 | Tsuruta et al. |
| 2018/0233720 A1 | 8/2018 | Gang et al. |
| 2020/0013573 A1 | 1/2020 | Won et al. |
| 2020/0035979 A1 | 1/2020 | Yamamoto et al. |
| 2020/0194843 A1 | 6/2020 | Kwon et al. |

FOREIGN PATENT DOCUMENTS

| | | |
|---|---|---|
| JP | H10322849 A | 12/1998 |
| JP | 2000-156922 A | 6/2000 |
| JP | 2002117815 A | 4/2002 |
| JP | 2007035393 A | 2/2007 |
| JP | 2007280854 A | 10/2007 |
| JP | 2009137408 A | 6/2009 |
| JP | 2010114962 A | 5/2010 |
| JP | 2010153130 A | 7/2010 |
| JP | 2014022195 A | 2/2014 |
| JP | 2014199716 A | 10/2014 |
| JP | 2015054444 A | 3/2015 |
| JP | 5785630 B2 | 9/2015 |
| JP | 2017059436 A | 3/2017 |
| JP | 2018063838 A | 4/2018 |
| JP | 2018120865 A | 8/2018 |
| JP | 2018535518 A | 11/2018 |
| KR | 20060037738 A | 5/2006 |
| KR | 20130003365 U | 6/2013 |
| KR | 101293917 B1 | 8/2013 |
| KR | 20170099670 A | 9/2017 |
| KR | 20180068158 A | 6/2018 |
| KR | 20180069747 A | 6/2018 |
| KR | 101974607 B1 | 5/2019 |
| KR | 20190051237 A | 5/2019 |
| WO | 2016199558 A1 | 12/2016 |

OTHER PUBLICATIONS

Extended European Search Report including Written Opinion for Application No. 20851473.7 dated Jun. 27, 2022, pp. 1-12.

* cited by examiner

ELECTRIC COMPONENT HOUSING OF BATTERY MODULE

CROSS-REFERENCE TO RELATED APPLICATIONS

The present application is a national phase entry under 35 U.S.C. § 371 of International Application No. PCT/KR2020/009888 filed Jul. 27, 2020, published in Korean, which claims priority from Korean Patent Application No. 10-2019-0098993 filed Aug. 13, 2019, all of which are incorporated herein by reference.

TECHNICAL FIELD

The present disclosure relates to an electric component housing, and more specifically, to an electric component housing of a battery module, which aims to improve package efficiency by reinforcing rigidity and integrating a bus bar or the like to the housing.

BACKGROUND ART

Secondary batteries currently commercialized include nickel cadmium batteries, nickel hydrogen batteries, nickel zinc batteries, lithium secondary batteries and so on. Among them, the lithium secondary batteries are more highlighted in comparison to nickel-based secondary batteries due to advantages such as free charging and discharging, caused by substantially no memory effect, very low self-discharge rate, and high energy density.

Recently, secondary batteries are widely used not only in small devices such as portable electronic devices but also in middle-sized or large-sized devices such as electric vehicles and energy storage systems (ESS). When used in the electric vehicle, for example, a large number of secondary batteries are electrically connected to form a battery module, and a plurality of battery modules are connected to configure a battery pack, in order to increase energy capacity and output.

The housing of various electric components inside the battery module/pack mainly uses injection molding. The injection-molded product is made of plastic, and resin serving as a material for injection molding is melted under high heat and then put into a mold to complete the product.

The injection molding process essentially has a disadvantage of causing deformation of the product during the cooling process after injection as the high-temperature resin contacts an external ambient temperature. This deformation deteriorates dimensional reliability of the product and weakens mechanical strength of the injection-molded product. Therefore, there is a need to reduce the deformation amount during the cooling process and to secure the strength and reliability of the electric component housing after injection.

Meanwhile, the battery module may include various electric components for controlling charging and discharging of battery cells, such as a battery management system (BMS), a relay, a current sensor, and a fuse. The electric component housing integrally houses the various electric components. However, in line with the trend of miniaturization of the battery module/pack, the size of the electric component housing is also being reduced. Therefore, there is a need to increase the space utilization of the electric component housing by minimizing the space occupied by cables or bus bars in the electric component housing.

SUMMARY

Technical Problem

The present disclosure is directed to providing an electric component housing with high mechanical rigidity and deformation prevention after injection molding.

The present disclosure is also directed to providing an electric component housing with space freedom and convenient electric component packaging by integrating bus bars or the like to the housing.

Other objects and advantages of the present disclosure will be described below, and will be appreciated by embodiments of the present disclosure. In addition, the objects and advantages of the present disclosure can be realized by components defined in the claims and a combination thereof.

Technical Solution

In one aspect of the present disclosure, there is provided an electric component housing of a battery module, which accommodates electric components, the electric component housing comprising: a housing body; and a metal support structure embedded inside the housing body.

The housing body may be made of a plastic material, and the housing body may be injection molded with the metal support structure.

The housing body may include a bottom surface portion and a wall along a peripheral edge of the bottom surface portion, and the metal support structure may be embedded inside at least one of the bottom surface portion and the wall.

The metal support structure may include at least one bus bar, the at least one bus bar may include first and second terminal portions and a connection portion configured to form a current path between the terminal portions, each terminal portion including a respective fastening hole, the first and second terminal portions of the at least one bus bar may be exposed to an inner space of the housing body, and the connection portion of the bus bar may be embedded inside at least one of the bottom surface portion and the wall.

The electric component housing may further comprise a box-shaped terminal support positioned in a corner area of the bottom surface portion, the first terminal portion may be disposed at an upper surface of the terminal support, and the second terminal portion may be extends upwards from the bottom surface portion.

The housing body may include a plurality of heat dissipation holes in the bottom surface portion, wherein at least a part of the connection portion of the bus bar is exposed to an exterior of the housing body by one or more of the plurality of heat dissipation holes.

The metal support structure may include at least one horizontal frame extending in a horizontal direction of the bottom surface portion and at least one vertical frame extending in a vertical direction of the bottom surface portion.

The housing body may further include a flange portion protruding outward from the wall portion and coplanar with the bottom portion, and the vertical frame may include a bushing hole in the flange portion and configured to receive a bolt therethrough.

In another aspect of the present disclosure, there is also provided a battery module, comprising the electric component housing described in any of the embodiments herein.

In still another aspect of the present disclosure, there is also provided a method of manufacturing an electric component housing of a battery module, which accommodates electric components, the method comprising: embedding a metal support structure in a housing body by insert injection molding.

The method may include embedding at least one bus bar in the housing body, the at least one bus bar including: first and second terminal portions within an inner space defined by a bottom surface portion and a wall of the at least one bus bar; and a connection portion outside of the housing body and forming a current path between the first and second terminal portions; forming respective fastening holes in the first and second terminal portions; and exposing the terminal portions of the bus bar to an inner space of the housing body, wherein the connection portion of the bus bar is embedded inside at least one of a bottom portion and a wall portion of the housing body.

Embedding the metal support structure in the housing body may include aligning at least one horizontal frame of the metal support structure with a horizontal direction of the bottom surface portion and aligning at least one vertical frame of the metal support structure with a vertical direction of the bottom surface portion.

Advantageous Effects

According to an embodiment of the present disclosure, since the metal support structure may act as a skeleton of the housing body, it is possible to provide an electric component housing having high mechanical rigidity and deformation prevention after injection molding.

According to another embodiment of the present disclosure, since the bus bar or the like are manufactured in an integrated structure with the housing body, it is possible to provide an electric component housing that is convenient for electric component packaging.

In addition, in the electric component housing according to the present disclosure, since only the terminal portion of the bus bar is exposed out of the housing body and the remaining portion of the bus bar plays a role of the metal support structure, there is no need to coat the bus bar for insulation.

The effects of the present disclosure are not limited to the above, and effects not mentioned herein may be clearly understood from the present specification and the accompanying drawings by those skilled in the art.

DETAILED DESCRIPTION

Figure 1:
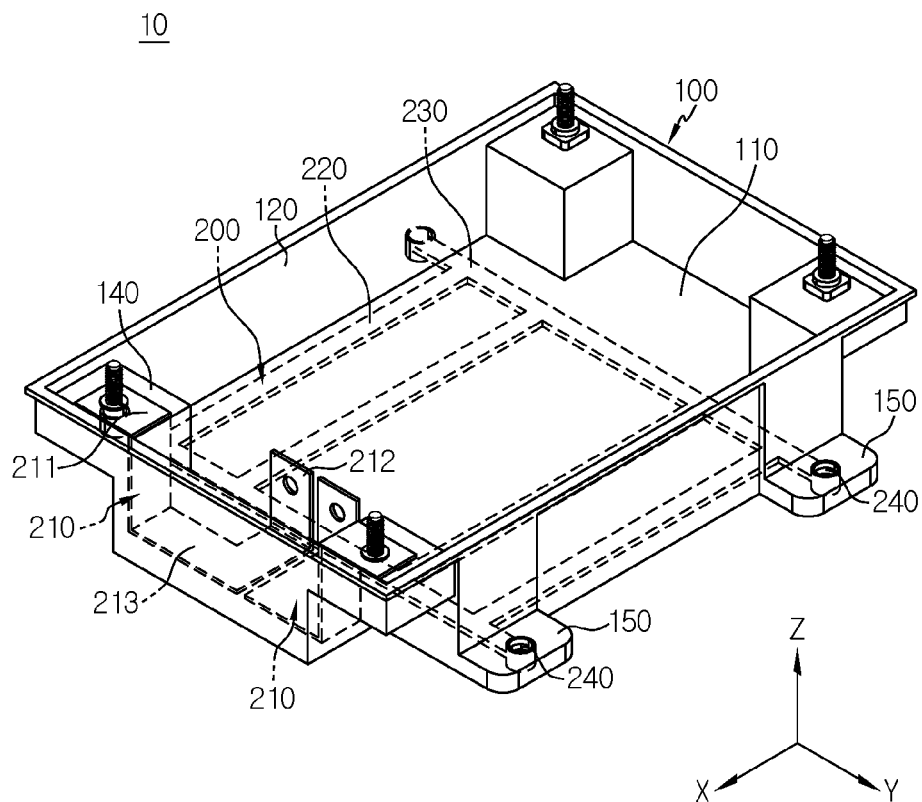
FIG. 1 is a schematic perspective view showing an electric component housing according to an embodiment of the present disclosure.

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the scope of the disclosure.

The embodiments disclosed herein are provided for more perfect explanation of the present disclosure, and thus the shape, size and the like of components may be exaggerated, omitted or simplified in the drawings for better understanding. Thus, the size and ratio of components in the drawings do not wholly reflect the actual size and ratio.

An electric component housing, which will be described below, is used to accommodate and protect various electric components inside a battery module or a battery pack. That is, the electric component housing mentioned in this embodiment may be included as a component of a battery module or a battery pack. Of course, the electric component housing according to the present disclosure does not necessarily have to be used only as a component of a battery module or battery pack. For example, the electric component housing may be applied as an electric component housing for an energy storage system and other electric devices.

Figure 2:
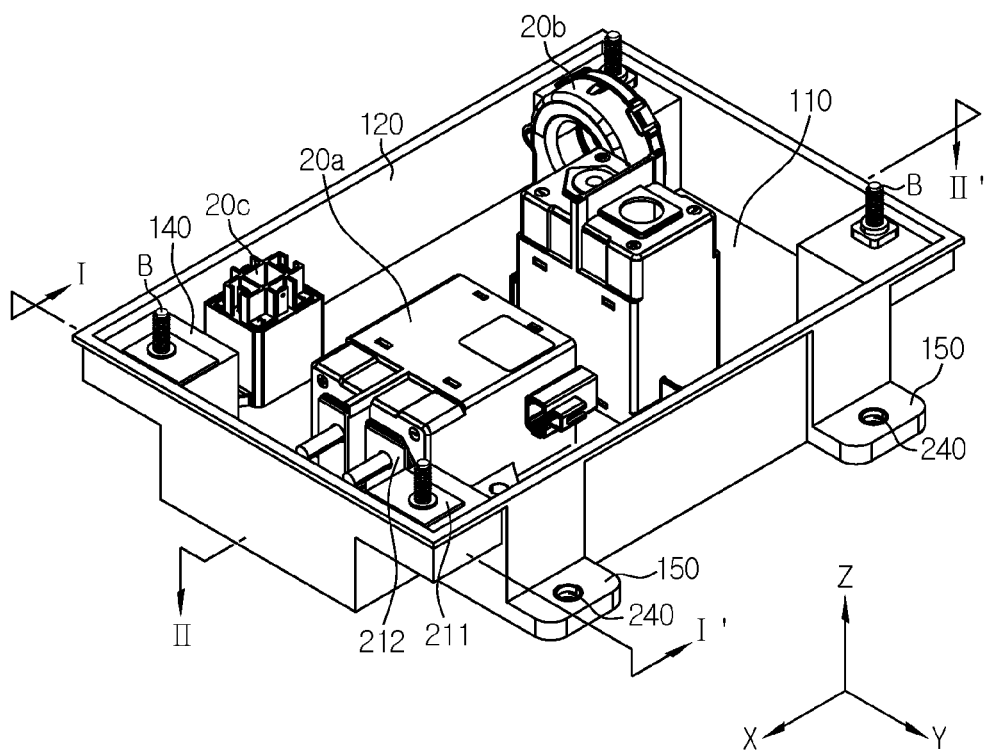
FIG. 2 is a diagram showing a state where electric components are accommodated in the electric component housing of FIG. 1.

FIG. 1 is a schematic perspective view showing an electric component housing according to an embodiment of the present disclosure, and FIG. 2 is a diagram showing a state where electric components are accommodated in the electric component housing of FIG. 1.

Referring to these drawings, an electric component housing 10 according to an embodiment of the present disclosure includes a housing body 100 forming an appearance, and a metal support structure 200 embedded in the housing body 100.

The housing body 100 includes a bottom portion 110 and a wall portion 120.

The bottom portion 110 is a portion that forms a bottom surface of the housing body 100 and may be provided in a substantially rectangular plate shape with a predetermined thickness. Electric components may be fixedly installed at a predetermined position on the bottom portion 110. The electric components may be, for example, a main relay 20a, a current sensor 20b, a precharge relay 20c, a register 20d, and the like.

The wall portion 120 is a portion that forms walls along a peripheral edge of the bottom portion 110 and may be integrally formed with the bottom portion 110. The electric components are arranged in the space of the bottom portion 110 surrounded by the wall portion 120. The housing body 100 may be fixedly installed at one side inside a battery module or a battery pack in a state where the space is shielded by a cover or is opened.

The metal support structure 200 is a component that acts as the skeleton of the housing body 100 inside the housing body 100. For example, the housing body 100 may be manufactured by insert injection molding in which the metal support structure 200 is put into an injection mold and resin serving as a raw material for injection is injected thereto. As will be described later, the metal support structure 200 may be embedded in at least one of the bottom portion 110 and the wall portion 120 of the housing body 100, and there is no particular limitation as long as it is a metal with mechanical rigidity such as stainless steel, copper, and aluminum alloy.

The metal support structure 200 has a relatively smaller thermal deformation coefficient than an injection-molded plastic product. In other words, since the metal support structure 200 has much better thermal durability than plastic, deformation hardly occurs even after injection. Since the metal support structure 200 is integrated into the injection-molded product, the amount of shrinkage of the injection-molded product may be reduced immediately after injection.

Therefore, the electric component housing 10 according to the present disclosure including the metal support structure 200 has an advantage of better dimensional accuracy and higher mechanical strength in comparison to a general injection-molded plastic product.

Meanwhile, the metal support structure 200 according to this embodiment may include at least one bus bar 210, a horizontal frame 220, and a vertical frame 230.

The bus bar 210 is a metal plate with certain thickness, width and length, and is a member that forms a large current path of the battery module/pack. The bus bar 210 may be provided to form various paths by bending or twisting to connect specific devices or terminals.

In the present disclosure, the bus bar 210 is used as one of the metal support structures 200. In other words, in the present disclosure, a significant part of the bus bar 210 is embedded into the electric component housing 10 and thus is utilized to reinforce the mechanical strength, and the insulation and space freedom in the electric component housing 10 may be improved.

The bus bar 210 includes both terminal portions 211, 212 and a connection portion 213 defining a current path between the both terminal portions 211, 212. The terminal portions 211, 212 have fastening holes and are bolted to terminals of external devices or electric components to make electrical connection and mechanical fixation. The connection portion 213 may extend as a predetermined path between both terminal portions 211, 212 to form various current paths.

Figure 3:
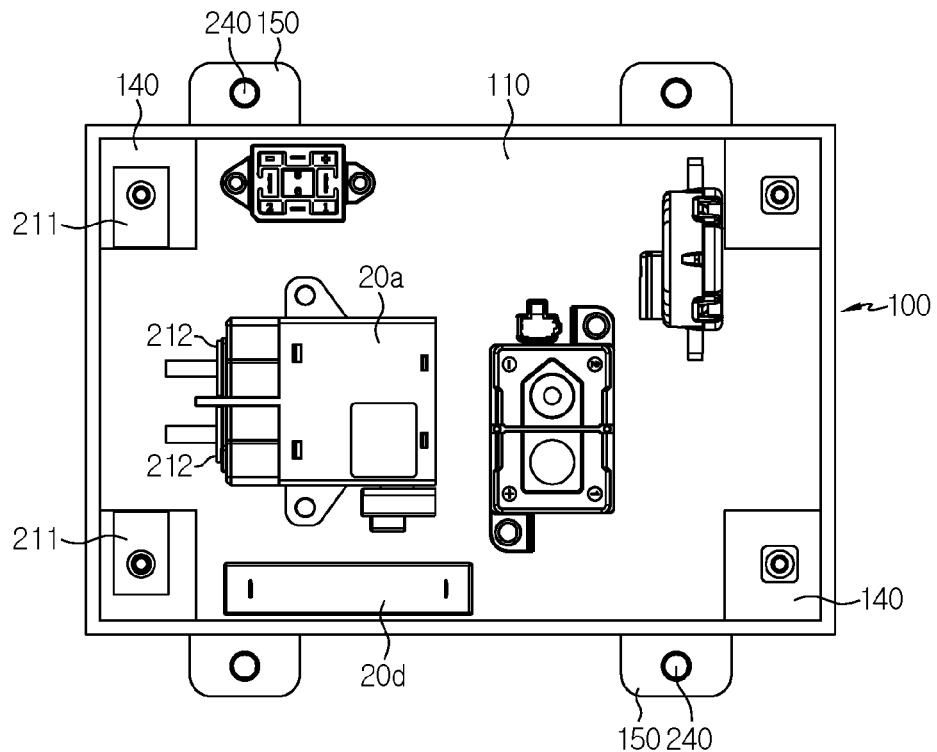
FIG. 3 is a plan view of FIG. 2.
Figure 4:
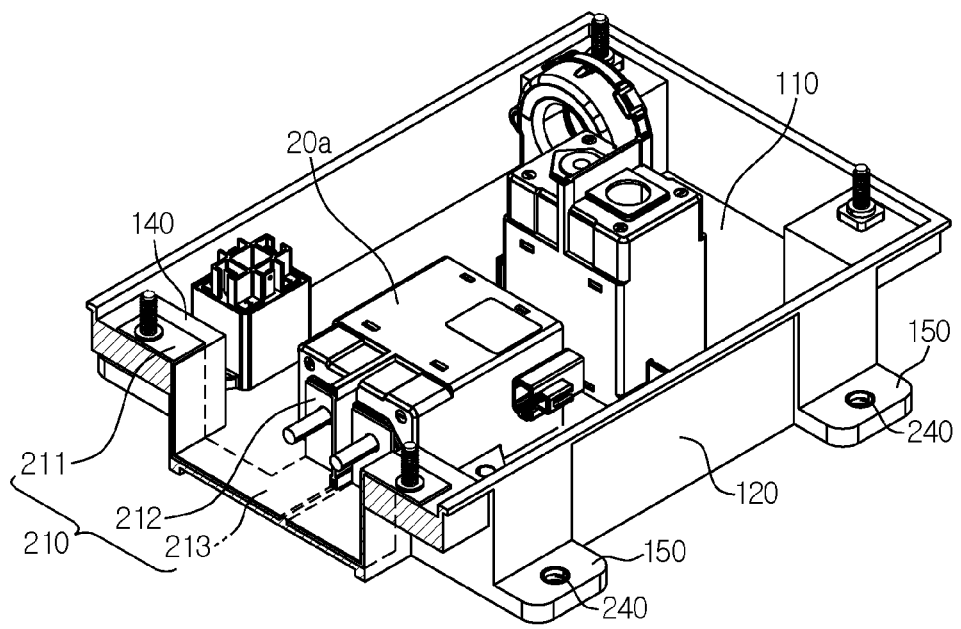
FIG. 4 is a sectional view, taken along the line I-I' of FIG. 2.

Specifically, referring to FIGS. 3 and 4 together, the bus bar 210 may be used as a part of the metal support structure 200 in the form that the terminal portions of the bus bar 210 are exposed to the inner space of the bottom portion 110 and the connection portion 213 of the bus bar 210 is embedded in at least one of the bottom portion 110 and the wall portion 120.

A box-shaped terminal support 140 may be further provided at a corner area of the bottom portion 110. The terminal support 140 is a structure that supports the terminal portion 211 of the bus bar 210 at a certain height from the bottom portion 110 and provides a place for embedding a part of the connection portion 213 therein.

One terminal portion 211 of the bus bar 210 may be placed horizontally on the upper surface of the terminal support 140, and the other terminal portion 212 may be disposed to stand upright from the bottom portion 110 at a position spaced apart from the one terminal portion 211 by a predetermined distance. Hereinafter, one terminal portion will be referred to as a first terminal portion 211 and the other terminal portion will be referred to as a second terminal portion 212.

Although not shown for convenience of drawing, the first terminal portion 211 may contact one end of another bus bar or one end of a cable connected to one of electrode terminals of a cell assembly, and may be fixed by being fastened with a bolt. At this time, an outer portion of the corner area of the housing body 100 where the terminal support 140 is provided may have a concave shape so that the bolt may pass through the terminal support 140 and be easily fastened to the fastening hole of the first terminal portion 211.

In addition, the second terminal portion 212 may contact one of electrode terminals of the main relay 20a located in the space inside the bottom portion 110. The electrode terminal of the main relay 20a may include a bolt that may be inserted into the fastening hole of the second terminal portion 212 and a metal plate corresponding to the second terminal portion 212.

The connection portion 213 is bent at least once and may extend from the first terminal portion 211 to the second terminal portion 212 through the inside of the terminal support 140 and the inside of the bottom portion 110.

In the conventional bus bar 210, the connection portion 213 is generally coated with an insulating tube for insulation and is disposed inside the electric component housing 10 to be exposed to the outside. However, in the present disclosure, the connection portion 213 is embedded in the housing body 100 to serve as a part of the metal support structure 200, so it is possible to exclude coatings such as insulating tubes. In particular, the rigid bus bar with a complicated path is difficult to be coat by inserting into an insulating tube or the like, and the insulating tube itself is also expensive. In this respect, the present disclosure is advantageous not only in enhancing the mechanical strength of the electric component housing 10, but also in manufacturing the bus bar 210 and reducing cost.

In this embodiment, one of the two bus bars 210 is used to form a current path between a positive electrode terminal of the cell assembly and a positive electrode terminal of the relay device, and the other bus bar 210 is used to form a current path between a negative electrode terminal of the cell assembly and a negative electrode terminal of the relay device. Although not shown, in addition to the relay device, an additional bus bar 210 may be further embedded in the electric component housing 10 in a similar manner for electrical connection of a current sensor, a precharge relay or the like.

If the intensity of the current flowing through the bus bar 210 is very large, heat may be generated, so the bus bar 210 for high voltage/high current needs to be cooled to maintain the temperature properly.

To this end, the housing body 100 according to this embodiment may further include a plurality of heat dissipation holes 130 formed by cutting a part of the bottom portion 110 so that at least a part of the connection portion 213 of the bus bar 210 is exposed out of the housing body 100.

Figure 5:
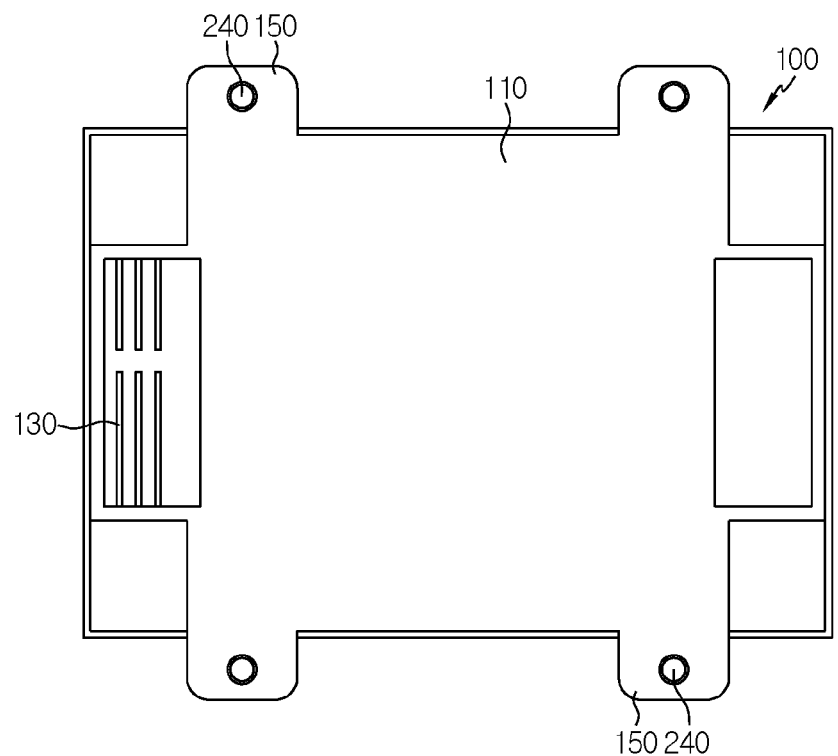
FIG. 5 is a bottom view of FIG. 2.

That is, as shown in FIG. 5, the heat dissipation holes 130 are provided at a rear surface of the bottom portion 110 in which the connection portion 213 of the bus bar 210 is embedded, among the bottom portion 110 of the housing body 100. The heat dissipation holes 130 may be formed, for example, in a grating structure. Therefore, according to this embodiment, the heat generated from the bus bar 210 may be dissipated toward the bottom of the housing body 100 through the heat dissipation holes 130. In order to more actively cool the bus bar 210, a small fan may be mounted under the heat dissipation holes 130 to air-cool the bus bar 210.

Figure 6:
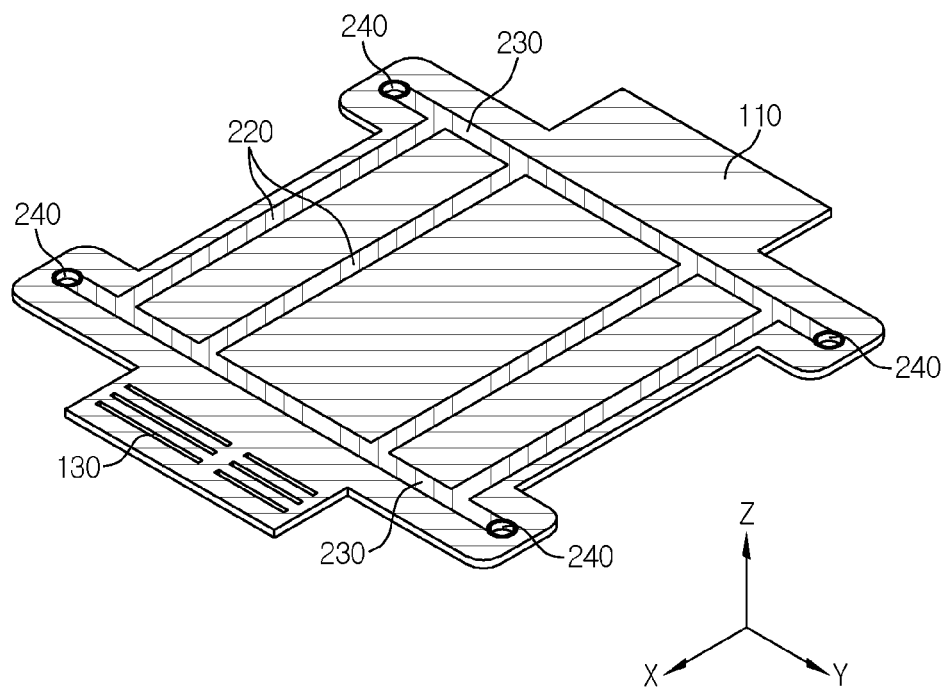
FIG. 6 is a sectional view, taken along the line II-II' of FIG. 2.

Meanwhile, the metal support structure 200 according to an embodiment of the present disclosure further includes a plurality of horizontal frames 220 and vertical frames 230. It may be desirable to evenly arrange the horizontal frames 220 and the vertical frames 230 within the area range of the bottom portion 110 so as to reduce the deformation of the bottom portion 110 as much as possible. To this end, referring to FIGS. 1 and 6 together, the horizontal frames 220 are elongated along a horizontal direction (X-axis direction) of the bottom portion 110 and are disposed to be spaced apart from each other by a predetermined distance, and the vertical frames 230 may also be elongated along a vertical direction (Y-axis direction) of the bottom portion 110 and are disposed to be spaced apart from each other by a predetermined distance.

The assembly tolerance is generated larger when the bottom portion 110 forming the bottom surface of the electric component housing 10 is contracted and twisted, rather than when the wall portion 120 of the electric component housing 10 is contracted and twisted, so this embodiment focuses on preventing the deformation of the bottom portion 110 by embedding the metal support structure 200 in the bottom portion 110. However, unlike in this embodiment, it is also possible to further embed the horizontal frame 220 or the vertical frame 230 in the wall portion 120 additionally as desired.

The housing body 100 may further include a flange portion 150 configured to protrude out of the wall portion 120 from the bottom portion 110. The flange portion 150 may be used as a bolt fastening place when fixing the electric component housing 10 to, for example, a tray of the battery module or the battery pack.

Four flange portions 150 may be provided in total by providing two flange portions to each of both sides of the housing body 100 in the vertical direction (Y-axis direction). In addition, both ends of the vertical frame 230 may be located inside the flange portion 150. A bushing hole 240 through which a bolt may pass may be provided at the end of the vertical frame 230. In other words, the bushing hole 240 may be in a metal tube shape that is formed at the end of the vertical frame 230.

In the present disclosure, since the bushing hole 240 of the vertical frame 230 is located inside the flange portion 150, it is possible to prevent deformation of the housing body 100 after injection and reinforce the mechanical strength of the flange portion 150. Therefore, even if the flange portion 150 is strongly coupled to another structure using bolts in the future, the flange portion 150 may not be easily broken or damaged. This may be an advantage in stably installing the electric component housing 10 to the tray of the battery module or the battery pack.

Next, a method of manufacturing the electric component housing 10 according to the present disclosure will be briefly described as follows.

The method of manufacturing the electric component housing 10 includes a housing injection molding step of performing insert injection molding to make the housing body 100 such that the metal support structure 200 is embedded therein.

First, a step of designing the housing body 100 including the bottom portion 110 and the wall portion 120 according to various conditions such as the number and shape of electric components to be mounted and the path of the bus bar 210 for connect the electric components, and a step of preparing the metal support structure 200 to be embedded in the housing body 100 are performed.

Next, a housing injection molding step of performing insert injection molding such that the metal support structure 200 is embedded in housing body 100 is performed.

The housing injection molding step may be carried out by firstly putting the metal support structure 200 into an injection mold and injecting a plastic resin into the injection mold. At this time, the plastic resin may be any resin as long as it has certain durability and electrical insulation.

As described above, the metal support structure 200 may employ all of the bus bar 210, the horizontal frame 220, and the vertical frame 230.

In the case of the bus bar 210, the connection portion 213 is entirely embedded inside at least one of the bottom portion 110 and the wall portion 120, except for the terminal portion of the bus bar 210. Also, all of the horizontal frame 220 and the vertical frame 230 are elongated along the horizontal and vertical directions of the bottom portion 110 and are embedded to be evenly distributed over the area of the bottom portion 110.

Next, the housing body 100 is cooled and solidified while maintaining the pressure in the injection mold. At this time, as described above, since the metal support structure 200 is evenly embedded in the housing body 100, the change in dimensions of the injection-molded product may be minimized Subsequently, the electric component housing 10 hardened inside the injection mold is taken out, thereby completing the manufacturing process.

As described above, in the electric component housing 10 according to the present disclosure, since the metal support structure 200 is included in the housing body 100, the dimensional accuracy and mechanical strength of the housing body 100 may be improved after injection molding.

In addition, since the bus bar 210 is included in an integral structure with the housing body 100 as a part of the metal support structure 200, there is no need to separately coat the bus bar 210 with an insulating tube or the like and the space freedom is increased, so the electric components may be packaged very efficiently. By using the electric component housing 10, it may be very advantageous to simplify the overall assembly process of the battery module or the battery pack.

Meanwhile, the battery module according to the present disclosure may be configured to include the electric component housing described above, and the battery pack may be configured to include at least one battery module.

The battery pack may be applied to vehicles such as an electric vehicle or a hybrid electric vehicle. Also, the battery pack may be applied to energy storage systems or other IT products.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Meanwhile, even though the terms expressing directions such as "upper", "lower", "left" and "right" are used in the specification, they are just for convenience of description and can be expressed differently depending on the location of a viewer or a subject, as apparent to those skilled in the art.

What is claimed is:

1. An electric component housing of a battery module, which accommodates electric components, the electric component housing comprising:
    a housing body; and
    a metal support structure embedded inside the housing body,
    wherein the housing body includes a bottom surface portion and a wall along a peripheral edge of the bottom surface portion,
    the metal support structure is embedded inside at least one of the bottom surface portion and the wall,
    the metal support structure includes at least one bus bar,
    the at least one bus bar includes first and second terminal portions and a connection portion configured to form a current path between the terminal portions, each terminal portion including a respective fastening hole, and
    the first and second terminal portions of the at least one bus bar are exposed to an inner space of the housing body, and the connection portion of the bus bar is embedded inside at least one of the bottom surface portion and the wall.

2. The electric component housing according to claim 1, wherein the housing body is made of a plastic material, and
    the housing body is injection molded with the metal support structure.

3. The electric component housing according to claim 1, further comprising:
    a box-shaped terminal support positioned in a corner area of the bottom surface portion,
    wherein the first terminal portion is disposed at an upper surface of the terminal support, and the second terminal portion is extends upwards from the bottom surface portion.

4. The electric component housing according to claim 1, wherein the housing body includes a plurality of heat dissipation holes in the bottom surface portion, wherein at least a part of the connection portion of the bus bar is exposed to an exterior of the housing body by one or more of the plurality of heat dissipation holes.

5. The electric component housing according to claim 1, wherein the metal support structure includes:
    at least one horizontal frame extending in a horizontal direction of the bottom surface portion; and
    at least one vertical frame extending in a vertical direction of the bottom surface portion.

6. The electric component housing according to claim 5, wherein the housing body further includes a flange portion protruding outward from the wall portion and coplanar with the bottom portion, and
    the vertical frame includes a bushing hole in the flange portion and configured to receive a bolt therethrough.

7. A battery module, comprising the electric component housing according to claim 1.

8. A method of manufacturing an electric component housing of a battery module, which accommodates electric components, the method comprising:
    embedding a metal support structure in a housing body by insert injection molding;
    embedding at least one bus bar in the housing body, the at least one bus bar including:
        first and second terminal portions within an inner space defined by a bottom surface portion and a wall of the at least one bus bar; and
        a connection portion outside of the housing body and forming a current path between the first and second terminal portions;
    forming respective fastening holes in the first and second terminal portions; and
    exposing the terminal portions of the bus bar to an inner space of the housing body, wherein the connection portion of the bus bar is embedded inside at least one of a bottom portion and a wall portion of the housing body.

9. The method of manufacturing an electric component housing according to claim 8, wherein embedding the metal support structure in the housing body comprises
    aligning at least one horizontal frame of the metal support structure with a horizontal direction of the bottom surface portion and aligning at least one vertical frame of the metal support structure with a vertical direction of the bottom surface portion.

* * * * *